United States Patent [19]

Yamaka et al.

[11] Patent Number: 4,972,245

[45] Date of Patent: Nov. 20, 1990

[54] INFRARED DETECTING ELEMENT

[75] Inventors: Eiso Yamaka, Ushiku; Takashi Moriyama, Kashiwa; Tamisuke Koizumi, Matsudo, all of Japan

[73] Assignees: National Space Development Agency of Japan; Foundation for Advancement of International Science, both of Japan

[21] Appl. No.: 327,464

[22] Filed: Mar. 22, 1989

[30] Foreign Application Priority Data

Mar. 23, 1988 [JP] Japan .................................. 63-68981

[51] Int. Cl.⁵ ............................................. H01L 27/12
[52] U.S. Cl. .......................................... 357/30; 357/4; 357/16; 357/24; 357/90
[58] Field of Search ..................... 357/30 N, 24, 90, 45

[56] References Cited

U.S. PATENT DOCUMENTS

| 4,316,103 | 2/1982 | Nathanson | 357/24 |
| 4,514,748 | 4/1985 | Bean | 357/90 |
| 4,725,870 | 2/1988 | Bean | 357/30 N |

FOREIGN PATENT DOCUMENTS 61-241985  10/1986  Japan .

OTHER PUBLICATIONS

"3p-N-9"; lecture in the thirty-third spring meeting of Applied Physical Society of Japan in 1986.
"Impurity Germanium and Silicon Infrared Detectors" by P. R. Bratt; Chapter 2 published from Academic Press in 1977, pp. 39-142.

Primary Examiner—Andrew J. James
Assistant Examiner—Reg Ratliff
Attorney, Agent, or Firm—Lowe, Price, LeBlanc, Becker & Shur

[57] ABSTRACT

An intermediate layer made of an $Si_{1-X}Ge_X$ mixed crystal layer is formed on an Si crystal substrate, where the character X denotes a value in the range of 0 to 1. The intermediate layer is connected to the substrate via a heterojunction generating a first heterojunction barrier. An Si crystal layer is formed on the intermediate layer and is connected to the intermediate layer via a heterojunction generating a second heterojunction barrier. The substrate, the intermediate layer, and the Si layer form a laminated structure. The first and second heterojunction barriers form a charge storage well in an energy band of the intermediate layer. Charges in the well are excited by absorbing infrared light. The intermediate layer contains unevenly-distributed impurities whose concentration montonically varies in a direction along a thickness of the laminated structure. The variation in the concentration generates an internal electric field in the energy band of the intermediate layer. The internal electric field increases a probability of movement of the excited charges from the well into one of the substrate and the Si layer.

3 Claims, 3 Drawing Sheets

INFRARED DETECTING ELEMENT

BACKGROUND OF THE INVENTION

This invention relates to an infrared detecting element and also an infrared imaging device.

Some infrared detectors use Si crystals and detect infrared rays having wavelengths equal to or longer than several micrometers. Such infrared detectors are of two types, the first type being produced by doping impurities into the Si crystals and the second type using heterojunction barriers.

Infrared Detectors II, Chapter 2, Semiconductors and Semimetals, written by P. R. Bratt, published from Academic Press in 1977, discloses the first-type infrared detectors.

Japanese published unexamined patent application 61-241985 discloses the second-type infrared detector. The documents "3P79" of the lecture in the thirty-third spring meeting of Applied Physical Society of Japan in 1986 also discloses the second-type infrared detector.

These two types of infrared detectors are useful for infrared two-dimensional imaging devices of a monolithic type. The first-type infrared detectors have the following drawback. Since the quantity of doped impurities is limited, the detector sensitivity is low and the detected wavelength is fixed in dependence on the type of the impurities. Accordingly, it is impossible to maximize the detector sensitivity at an arbitrary wavelength. The second-type infrared detectors are free from such a drawback.

SUMMARY OF THE INVENTION

It is an object of this invention to provide an excellent infrared detecting element and an excellent infrared imaging device.

In an infrared detecting element of this invention, an intermediate layer made of an $Si_{1-x}Ge_x$ mixed crystal layer is formed on an Si crystal substrate, where the character X denotes a value in the range of 0 to 1. The intermediate layer is connected to the substrate via a heterojunction generating a first heterojunction barrier. An Si crystal layer is formed on the intermediate layer and is connected to the intermediate layer via a heterojunction generating a second heterojunction barrier. The substrate, the intermediate layer, and the Si layer form a laminated structure. The first and second heterojunction barriers form a charge storage well in an energy band of the intermediate layer. Charges in the well are excited by absorbing infrared light. The intermediate layer contains unevenly-distributed impurities whose concentration monotonically varies in a direction along a thickness of the laminated structure. The monotonic variation in the concentration generates an internal electric field, which can increase a probability of movement of the excited charges from the well into one of the substrate and the Si layer, in the energy band of the intermediate layer. The internal electric field increases a probability of movement of the excited charges from the well into one of the substrate and the Si layer.

An infrared imaging device of this invention includes an infrared detecting element and a charge-coupled device connected to the infrared detecting element. The infrared detecting element includes an Si crystal substrate, an intermediate layer, and an Si layer. The intermediate layer is formed on the substrate and is made of an $Si_{1-x}Ge_x$ mixed crystal layer, where the character X denotes a value in the range of 0 to 1. The intermediate layer is connected to the substrate via a heterojunction generating a first heterojunction barrier. The Si layer is formed on the intermediate layer and is connected to the intermediate layer via a heterojunction generating a second heterojunction barrier. The substrate, the intermediate layer, and the Si layer form a laminated structure. The first and second heterojunction barriers form a charge storage well in an energy band of the intermediate layer. Charges in the well can be excited by absorbing infrared light. The intermediate layer contains unevenly-distributed impurities whose concentration monotonically varies in a direction along a thickness of the laminated structure. The monotonic variation in the concentration generates an internal electric field in the energy band of the intermediate layer. The internal electric field increases a probability of movement of the excited charges from the well into one of the substrate and the Si layer. The charge-coupled device further transfers the charges through a train of cells in the charge-coupled device to an output.

BRIEF DESCRIPTION OF THE DRAWINGS

Like and corresponding elements are denoted by the same reference characters throughout the drawings.

DESCRIPTION OF THE PREFERRED EMBODIMENTS

Before the description of the embodiments of this invention, prior art infrared detecting elements will be described hereafter for a better understanding of this invention.

Figure 1:
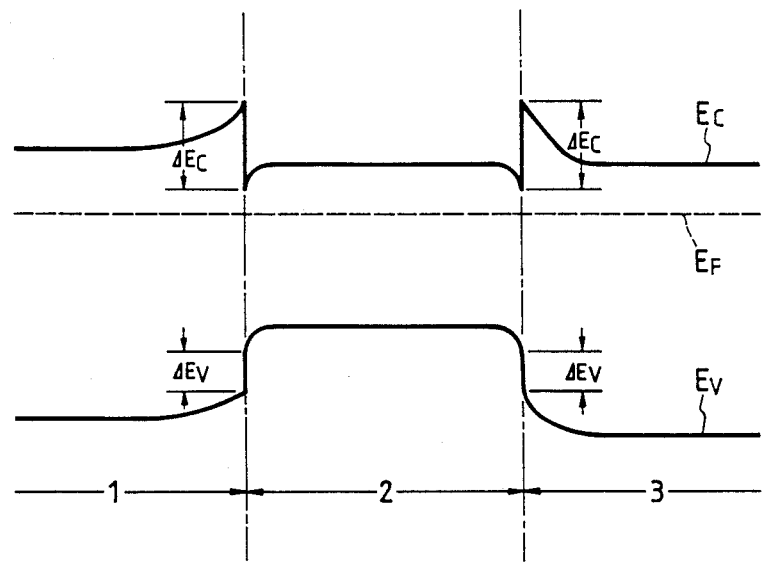
FIG. 1 is a diagram of a structure of energy bands in a prior art infrared detecting element.

FIG. 1 shows energy bands of a prior art infrared detecting element which uses a charge storage well formed by heterojunction barriers and which has a laminated structure of an n-type Si substrate 1, an intermediate n-type Ge layer 2, and an n-type Si layer 3.

The prior art infrared detecting element of FIG. 1 has heterojunctions between the left-hand Si substrate 1 and the intermediate Ge layer 2, and between the right-hand Si layer 3 and the intermediate Ge layer 2. In each of the heterojunctions, there are potential barriers of $\Delta E_c$ and $\Delta E_v$ at the conduction band and the valence band respectively. In this case, a potential well is formed in the conduction band of the n-type Ge layer 2 by the potential barriers of $\Delta E_c$. The Si substrate 1 and the Si layer 3 form electrodes at the opposite sides of the potential well.

In cases where charges (electrons) are previously stored in the potential well, when infrared rays to be detected are applied to the infrared detecting element, the charges absorb photons of the infrared rays and are excited into excited states in the potential well, moving into the electrode, that is, the n-type Si substrate 1 or the n-type Si layer 3, and thus forming photo-carriers.

The infrared detecting element of FIG. 1 is sensible to infrared light having a wavelength equal to or shorter than a cutoff wavelength $\lambda_c$ which is determined by the barrier height $\Delta E_c$ as follows:

$$\lambda_c = h \cdot c / \Delta E_c$$

where the character "h" denotes Planck's constant and the character "c" denotes the light velocity in a vacuum. For example, when the barrier height $\Delta E_c$ is equal to 0.2 eV, the cutoff wavelength is equal to 6.2 micrometers.

In cases where an n-type $Si_{1-X}Ge_X$ layer is used in place of the intermediate n-type Ge layer, the barrier height $\Delta E_c$ drops from 0.2 eV to 0 eV as the value X decreases from 1 to 0. Accordingly, the cutoff frequency $\lambda_c$ theoretically lengthens from 6.2 micrometers to the infinite as the value X decreases from 1 to 0.

Figure 2:
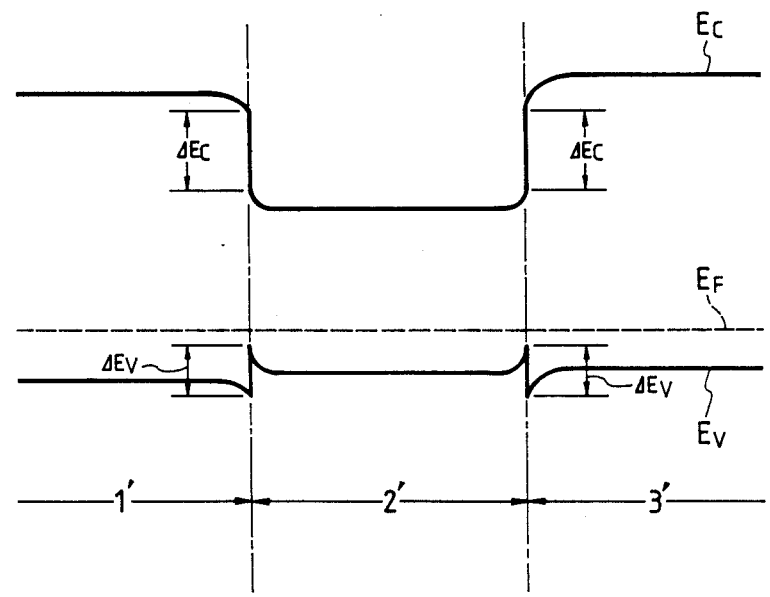
FIG. 2 is a diagram of a structure of energy bands in another prior art infrared detecting element.

FIG. 2 shows energy bands of another prior art infrared detecting element which has a laminated structure of a p-type Si substrate 1', an intermediate p-type Ge layer 2', and a p-type Si layer 3'.

The prior art infrared detecting element of FIG. 2 has heterojunctions between the left-hand Si substrate 1', and the intermediate Ge layer 2', and between the right-hand Si layer 3' and the intermediate Ge layer 2'. In each of the heterojunctions, there are potential barriers of $\Delta E_c$ and $\Delta E_v$ at the conduction band and the valence band respectively. In this case, a potential well is formed in the valence band of the p-type Ge layer 2' by the potential barriers of $\Delta E_v$.

Figure 3:
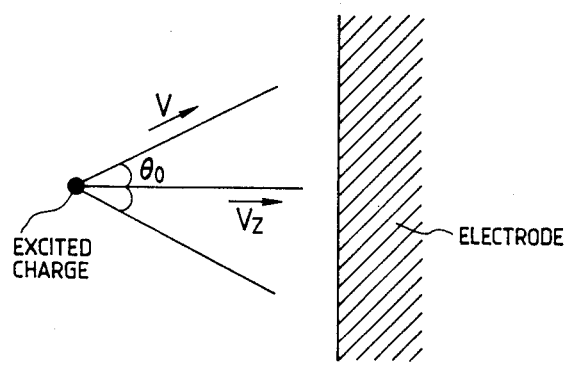
FIG. 3 is a diagram of an excited charge, its velocity components, and an electrode in the infrared detecting elements of FIGS. 1 and 2.

In the prior art infrared detecting elements of FIGS. 1 and 2, the excited charges form photo-carriers only when the following condition is satisfied.

$$mV_z^2/2 \geq \Delta E_c \text{ (or } \Delta E_v)$$

where the character "m" denotes a mass of the charge. In addition, as shown in FIG. 3, the character $V_z$ denotes a component of a velocity V of the charge which is perpendicular to the surface of an electrode formed by the Si substrate or the Si layer. When the angle between the vectors V and $V_z$ is denoted by the character "$\theta$", the following equation is obtained.

$$V_z = V \cdot \cos\theta$$

From the condition mentioned above, the charges excited by the infrared light can form photo-carriers under the following conditions. A wavelength $\lambda$ of infrared light to be detected is in a given range as follows:

$$\lambda \leq h \cdot C / \Delta E_c \text{ (or } \Delta E_v)$$

The incident angle $\theta$ of the excited charge must be smaller than a given angle $\theta_o$ determined in the following relationship.

$$m(V \cdot \cos\theta_o)^2/2 \geq \Delta E_c \text{ (or } \Delta E_v)$$

Accordingly, the sensitivity of the prior art infrared detecting element of FIG. 1 or FIG. 2 drops at a rate proportional to a value "$(\lambda - \lambda_c)^2/\lambda_c$" as the wavelength of the detected infrared light varies away from the cutoff wavelength $\lambda_c$. Especially, in a wavelength range near the cutoff wavelength $\lambda_c$, the sensitivity drops almost to zero.

A conceivable way of increasing the sensitivity is to apply a voltage between the electrodes at the opposite sides of the potential well to increase the probability of movement of the excited electrons into one of the electrodes. In general, the conceivable way can not be applied to the prior art infrared detecting element with the $Si_{1-X}Ge_X$ layer for the following reasons. The $Si_{1-X}Ge_X$ layer, which forms a well determined by the heterojunction barriers, has a greater concentration of impurities than concentrations of impurities in the electrodes, that is, the Si substrate and the Si layer. Accordingly, the applied voltage causes only a small effective electric field in the $Si_{1-X}Ge_X$ layer which acts on the excited charges. In addition, if the prior art infrared detecting element is used in an infrared imaging device including charge-coupled devices, since the electrodes are charge collecting electrodes of respective picture pixels of the imaging device, a structure enabling the application of an external voltage is complicated and is impractical.

This invention eliminates the previously-mentioned drawbacks of the prior art infrared detecting element. A basic structure of an infrared detecting element of this invention includes an Si crystal substrate, an intermediate layer formed on the substrate, and an Si crystal layer formed on the intermediate layer. The intermediate layer includes a mixed crystal of $Si_{1-X}Ge_X$, where the value X is in the range of 0 to 1. Embodiments of this invention will be described hereafter with reference to drawings.

Figure 4:
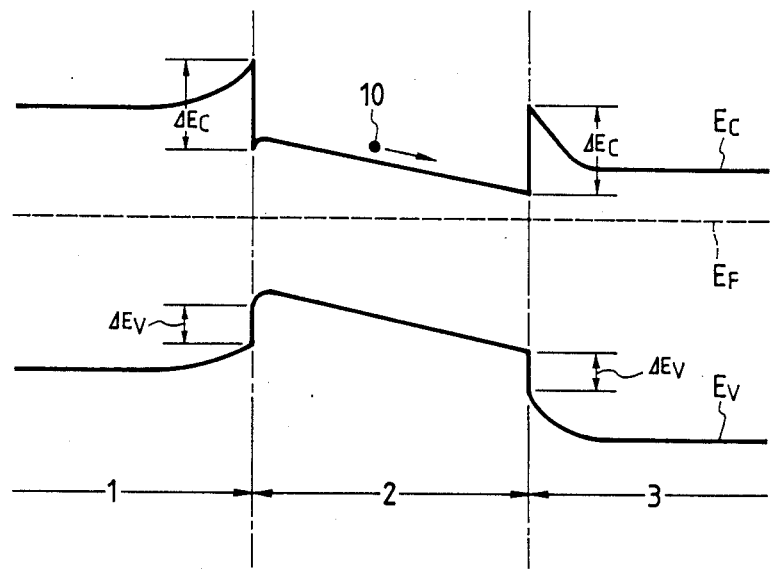
FIG. 4 is a diagram of a structure of energy bands in an infrared detecting element according to a first embodiment of this invention.

FIG. 4 shows energy bands of an infrared detecting element according to a first embodiment of this invention. The infrared detecting element of FIG. 4 uses a charge storage well formed by heterojunction barriers and has a laminated structure of an n-type Si crystal substrate 1, an intermediate n-type Ge crystal layer 2, and an n-type Si crystal layer 3. The Ge layer 2 is formed on the Si substrate 1. The Si layer 3 is formed on the Ge layer 2. It should be noted that the Ge layer 2 may be replaced by an n-type $Si_{1-X}Ge_X$ mixed crystal layer, where the value X is in the range of 0 to 1.

The infrared detecting element of FIG. 4 has heterojunctions between the left-hand Si substrate 1 and the intermediate Ge layer 2, and between the right-hand Si layer 3 and the intermediate Ge layer 2. In each of the heterojunctions, there are potential barriers of $\Delta E_c$ and $\Delta E_v$ in the conduction band and the valence band of the intermediate Ge layer 2 respectively. In this case, a potential well is formed in the conduction band of the Ge layer 2 by the potential barriers of $\Delta E_c$. The Si substrate 1 and the Si layer 3 form electrodes at the opposite sides of the potential well.

During the fabrication of the infrared detecting element of FIG. 4, doped donor impurities are distributed unevenly in the Ge layer 2. Specifically, the doped quantity of donor impurities in the Ge layer 2 monotonically increases in a direction along a thickness of the laminated structure from the Si substrate 1 toward the Si layer 3. In other words, the concentration of the donor impurities in the intermediate layer 2 monotonically increases in a direction from the Si substrate 1 toward the Si layer 3. Accordingly, a bottom of the conductive band and a top of the valence band of the Ge layer 2 have energy levels which slope downward in the direction from the Si substrate 1 toward the Si layer 3, whose mechanism is explained in the following. The slope of the energy level in the conduction band of the Ge layer 2 serves as an internal electric field which forces electrons in the potential well toward the Si layer 3.

One method for monotonic variation of doped impurities in the $Si_{1-x}Ge_x$ layer can be realized by the monotonic variation of an impurity-cell temperature during Si and Ge evaporations from Si and Ge cells in the evaporation method, such as a molecular beam epitaxy (MBE) method.

The monotonic variation in the concentration of donor impurities in the Ge layer 2 causes a variation in the Fermi-level which results in the sloping energy level of the bottom of the conduction band of the Ge layer 2. The Fermi-level $E_F$ is expressed by the following known equation.

$$E_F = E_D + kT \ln[(-\tfrac{1}{2}) + (\tfrac{1}{2})\{1 + (8N_D/N_C)\exp((E_C - E_D)/kT)\}^{\frac{1}{2}}]$$

where the characters $E_C$ and $E_D$ denote the energy level of the bottom of the conduction band and the donor level in the Ge layer 2 respectively. In addition, the character $N_C$ denotes the state density of the bottom of the conduction band in the Ge layer 2. The Fermi-level $E_F$ moves from the donor level $E_D$ towards the bottom of the conduction band $E_c$ for the increase of the donor density $N_D$, by the above equation.

In cases where electrons 10 are previously stored in the potential well, when infrared rays to be detected are applied to the infrared detecting element, the electrons 10 absorb photons of the infrared rays and are excited into excited states in the potential well. Some of the excited charges 10 move into the Si layer 3 over the potential barrier of $\Delta E_c$ and form photo-carriers. The previously mentioned internal electric field facilitates the movement of the excited electrons 10 into the Si layer 3, increasing the probability of the occurrence of photo-carriers and thus improving the sensitivity of the infrared detecting element.

Figure 5:
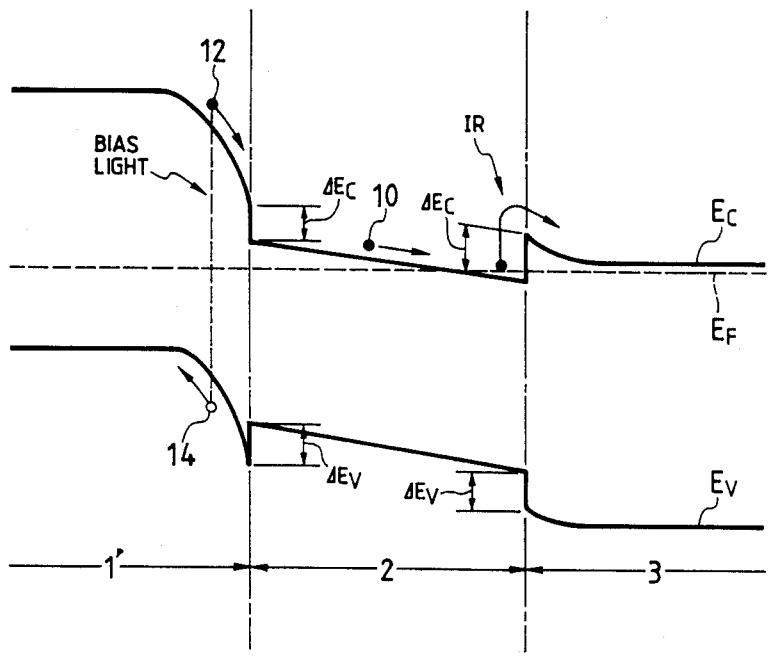
FIG. 5 is a diagram of a structure of energy bands in an infrared detecting element according to a second embodiment of this invention.

FIG. 5 shows energy bands of an infrared detecting element according to a second embodiment of this invention which is similar to the embodiment of FIG. 4 except that a p-type Si crystal substrate 1' is used in place of the n-type Si crystal substrate 1.

During a preliminary operation of the infrared detecting element of FIG. 5, electrons 10 are stored in a potential well of an intermediate layer 2. Specifically, visible bias light is applied to the p-type Si substrate 1' so that electrons 12 and holes 14 are generated at the conduction band and the valence band of the p-type Si substrate 1' respectively. The generated electrons 12 drop into the potential well of the intermediate layer 2 and are stored in the potential well.

After the preliminary operation is completed, infrared rays to be detected are applied to the infrared detecting element so that the electrons 10 in the potential well absorb photons of the infrared rays and are excited into excited states. Some of the excited electrons 10 move into an Si layer 3 and form photo-carriers. As in the embodiment of FIG. 4, an internal electric field facilitates the movement of the excited electrons 10 into the Si layer 3, increasing the probability of the occurrence of photo-carriers and thus improving the sensitivity of the infrared detecting element.

An infrared detecting element of a third embodiment of this invention is similar to the embodiment of FIG. 4 except for the following design changes. The third embodiment has a laminated structure of a p-type Si substrate, an intermediate p-type Ge layer, and a p-type Si layer. The concentration of acceptor impurities in the p-type Ge layer is monotonically varied in a direction from the Si substrate toward the Si layer. The p-type Ge layer may be replaced by a p-type mixed crystal layer of $Si_{1-x}Ge_x$.

Figure 6:
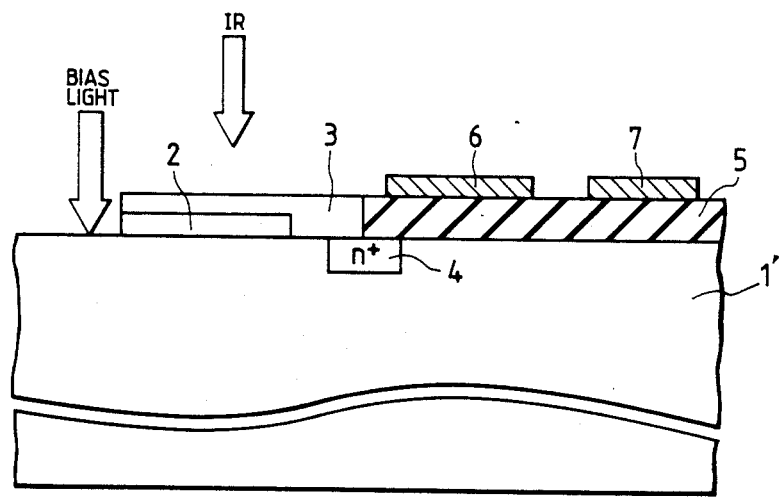
FIG. 6 is a sectional view of an infrared imaging device according to a fourth embodiment of this invention.

FIG. 6 shows a monolithic infrared imaging device according to a fourth embodiment of this invention in which an infrared detecting element of FIG. 5 is connected to a charge-coupled device (CCD).

In the device of FIG. 6, the infrared detecting element includes a p-type Si crystal substrate 1', an n-type Ge crystal layer 2 formed on the p-type Si substrate 1', and an n-type Si crystal layer 3 formed on the n-type Ge layer 2. Visible bias light is applied to an exposed surface of the p-type Si substrate 1'. Infrared light IR to be detected is applied to an upper surface of the n-type Si layer 3. An n-type separation region 4 (injection stopping region) called "a guard ring" is formed in the p-type Si substrate 1'. During the application of the visible bias light, the n-type region 4 stops the injection of holes from a peripheral area into an inversion layer of the hetero junction between the p-type Si substrate 1' and the n-type Ge layer 2. An edge of the n-type Si layer 3 extends on the n-type region 4.

An insulating layer 5 of $SiO_2$ is formed on the p-type Si substrate 1'. An edge of the insulating layer 5 extends on the n-type region 4. The insulating layer 5 and the n-type Si layer 3 meet at a position above the n-type region 4. The application of the infrared light IR excites electrons in a potential well of the n-type Ge layer 2. Some of the excited electrons move into the n-type Si layer 3 and form photo-carriers. A transfer gate 6 formed on the insulating layer 5 constitutes a control gate for transferring the photo-carriers from the n-type Si layer 3 toward a subsequent input portion of a photo-carrier transferring CCD. A gate 7 of a CCD is formed on the insulating layer 5. The CCD gate 7 functions to receive the photo-carrier (electrons) from the transfer gate 6 and to control the transfer of the photo-carrier (electrons) toward an output terminal of the imaging device via an interior of the CCD.

Since the Si crystal substrate 1' can be excellent in quality, the integrating technique to fabricate the monolithic infrared imaging device can be performed suitably.

What is claimed is:

1. An infrared detecting element comprising:
an Si crystal substrate;
an intermediate layer formed on the substrate and made of an $Si_{1-x}Ge_x$ mixed crystal layer, the intermediate layer being connected to the substrate via a heterojunction generating a first heterojunction barrier, wherein the character X denotes a value in the range of 0 to 1;
an Si crystal layer formed on the intermediate layer and connected to the intermediate layer via a heterojunction generating a second heterojunction barrier;
wherein the substrate, the intermediate layer, and the Si layer form a laminated structure;
wherein the first and second heterojunction barriers form a charge storage well in an energy band of the intermediate layer, and charges in the well are excited by absorbing infrared light;
wherein the intermediate layer contains unevenly-distributed impurities whose concentration monotonically varies in a direction along a thickness of the laminated structure, the variation in the concentration generates an internal electric field in the energy band of the intermediate layer and the internal electric field increases a probability of movement of the excited charges from the well into one of the substrate and the Si layer.

2. An infrared detecting element comprising:

an Si crystal substrate;

an intermediate layer formed on the substrate and made of an $Si_{1-X}Ge_X$ mixed crystal layer, the intermediate layer being connected to the substrate via a heterojunction generating a first heterojunction barrier, wherein the character X denotes a value in the range of 0 to 1;

an Si crystal layer formed on the intermediate layer and connected to the intermediate layer via a heterojunction generating a second heterojunction barrier;

wherein the first and second heterojunction barriers form a charge storage well in an energy band of the intermediate layer, and charges in the well are excited by absorbing infrared light;

wherein the intermediate layer contains unevenly-distributed impurities whose concentration monotonically increases in a direction from the substrate toward the Si layer, the variation in the concentration generates a slope in the energy band of the intermediate layer and the slope increases a probability of movement of the excited charges from the well into the Si layer.

3. An infrared imaging device comprising:

an infrared detecting element including an Si crystal substrate, an intermediate layer, and an Si layer;

the intermediate layer being formed on the substrate and being made of an $Si_{1-X}Ge_X$ mixed crystal layer, the intermediate layer being connected to the substrate via a heterojunction generating a first heterojunction barrier, wherein the character X denotes a value in the range of 0 to 1;

the Si layer being formed on the intermediate layer and being connected to the intermediate layer via a heterojunction generating a second heterojunction barrier;

wherein the substrate, the intermediate layer, and the Si layer form a laminated structure;

wherein the first and second heterojunction barriers form a charge storage well in an energy band of the intermediate layer, and charges in the well are excited by absorbing infrared light;

wherein the intermediate layer contains unevenly-distributed impurities whose concentration monotonically varies in a direction along a thickness of the laminated structure, the variation in the concentration generates an internal electric field in the energy band of the intermediate layer and the internal electric field increases a probability of movement of the excited charges from the well into one of the substrate and the Si layer;

a charge-coupled device connected to the infrared detecting element for further transferring the charges from the Si layer.

* * * * *